(12) United States Patent
Yang et al.

(10) Patent No.: US 11,043,426 B2
(45) Date of Patent: Jun. 22, 2021

(54) DUMMY MOL REMOVAL FOR PERFORMANCE ENHANCEMENT

(71) Applicant: Taiwan Semiconductor Manufacturing Co., Ltd., Hsin-Chu (TW)

(72) Inventors: Hui-Ting Yang, Zhubei (TW); Chih-Ming Lai, Hsinchu (TW); Chun-Kuang Chen, Guanxi Township (TW); Chih-Liang Chen, Hsinchu (TW); Charles Chew-Yuen Young, Cupertino, CA (US); Jiann-Tyng Tzeng, Hsin Chu (TW); Kam-Tou Sio, Zhubei (TW); Meng-Hung Shen, Zhudong Township (TW); Ru-Gun Liu, Zhubei (TW); Wei-Cheng Lin, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/578,357

(22) Filed: Sep. 22, 2019

(65) Prior Publication Data
US 2020/0020588 A1 Jan. 16, 2020

Related U.S. Application Data

(60) Division of application No. 16/154,035, filed on Oct. 8, 2018, which is a continuation of application No.
(Continued)

(51) Int. Cl.
| | |
|---|---|
| H01L 21/8234 | (2006.01) |
| H01L 27/02 | (2006.01) |
| H01L 27/088 | (2006.01) |
| H01L 27/092 | (2006.01) |
| H01L 29/423 | (2006.01) |

(Continued)

(52) U.S. Cl.
CPC ........ *H01L 21/823437* (2013.01); *H01L 21/823431* (2013.01); *H01L 21/823475* (2013.01);
(Continued)

(58) Field of Classification Search
CPC ........... H01L 23/5222; H01L 27/0207; G06F 17/5077
See application file for complete search history.

(56) References Cited

U.S. PATENT DOCUMENTS

| | | | |
|---|---|---|---|
| 10,096,522 B2 * | 10/2018 | Yang | H01L 21/823437 |
| 2002/0000663 A1 | 1/2002 | Nakayama | |

(Continued)

FOREIGN PATENT DOCUMENTS

KR    20010065772 A    7/2001

OTHER PUBLICATIONS

Non Final Office Action dated Oct. 24, 2019 in connection with U.S. Appl. No. 16/154,035.
(Continued)

*Primary Examiner* — Alia Sabur
(74) *Attorney, Agent, or Firm* — Eschweiler & Potashnik, LLC

(57) ABSTRACT

The present disclosure, in some embodiments, relates to a method of forming an integrated chip. The method may be performed by forming a plurality of gate structures over a substrate, and forming a plurality of source and drain regions along opposing sides of the plurality of gate structures. A plurality of middle-of-the-line (MOL) structures are formed at locations laterally interleaved between the plurality of gate structures. The plurality of MOL structures are redefined by getting rid of a part but not all of one or more of the plurality of MOL structures. Redefining the plurality of MOL structures results in a plurality of MOL active struc-
(Continued)

tures arranged over the plurality of source and drain regions at an irregular pitch.

20 Claims, 6 Drawing Sheets

Related U.S. Application Data

15/148,274, filed on May 6, 2016, now Pat. No. 10,096,522.

(51) Int. Cl.
H01L 29/78 (2006.01)
H01L 29/49 (2006.01)
H01L 29/66 (2006.01)

(52) U.S. Cl.
CPC ........ *H01L 27/0207* (2013.01); *H01L 27/088* (2013.01); *H01L 27/0924* (2013.01); *H01L 29/4238* (2013.01); *H01L 29/6653* (2013.01); *H01L 29/66545* (2013.01); *H01L 29/785* (2013.01); *H01L 27/0886* (2013.01); *H01L 27/092* (2013.01); *H01L 29/4916* (2013.01)

(56) References Cited

U.S. PATENT DOCUMENTS

| | | |
|---|---|---|
| 2006/0049460 A1 | 3/2006 | Chen et al. |
| 2007/0045860 A1 | 3/2007 | Nakamura |
| 2007/0108496 A1 | 5/2007 | Ino |
| 2008/0283925 A1 | 11/2008 | Berthold |
| 2009/0057923 A1 | 3/2009 | Kim et al. |
| 2012/0032268 A1 | 2/2012 | Hou et al. |
| 2013/0141963 A1 | 6/2013 | Liaw |
| 2013/0193500 A1 | 8/2013 | Chen |
| 2014/0070320 A1 | 3/2014 | Mukherjee et al. |
| 2014/0077305 A1 | 3/2014 | Pethe et al. |
| 2014/0284667 A1 | 9/2014 | Basker et al. |
| 2014/0292429 A1 | 10/2014 | Manipatruni et al. |
| 2014/0339610 A1* | 11/2014 | Rashed ............ H01L 29/66795 257/288 |
| 2015/0143319 A1 | 5/2015 | Lee et al. |
| 2016/0049395 A1* | 2/2016 | Okagaki ............ H01L 27/0207 257/401 |
| 2016/0079167 A1 | 3/2016 | Zhu et al. |
| 2017/0278747 A1* | 9/2017 | Adusumilli ........... H01L 23/485 |

OTHER PUBLICATIONS

Non-Final Office Action dated Dec. 16, 2016 for U.S. Appl. No. 15/148,274.
Final Office Action dated Jun. 16, 2017 for U.S. Appl. No. 15/148,274.
Non-Final Office Action dated Nov. 2, 2017 for U.S. Appl. No. 15/148,274.
Notice of Allowance dated May 31, 2018 for U.S. Appl. No. 15/148,274.

\* cited by examiner

DUMMY MOL REMOVAL FOR PERFORMANCE ENHANCEMENT

REFERENCE TO RELATED APPLICATIONS

This Application is a Divisional of U.S. application Ser. No. 16/154,035, filed on Oct. 8, 2018, which is a Continuation of U.S. application Ser. No. 15/148,274, filed on May 6, 2016 (now U.S. Pat. No. 10,096,522, issued on Oct. 9, 2018). The contents of the above-referenced Patent Applications are hereby incorporated by reference in their entirety.

BACKGROUND

Over the last four decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated chips may comprise millions or billions of semiconductor devices arranged on a single semiconductor die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
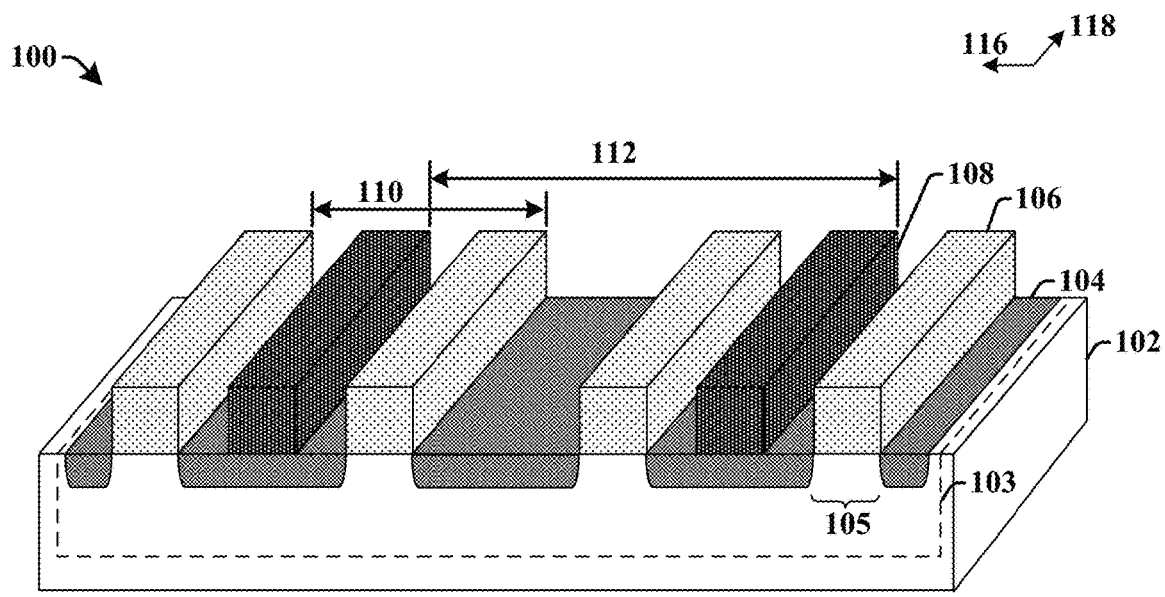
FIG. 1 illustrates three-dimensional view of some embodiments of a substrate having a middle-of-the-line (MOL) layer arranged at an irregular pitch to reduce parasitic capacitance.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
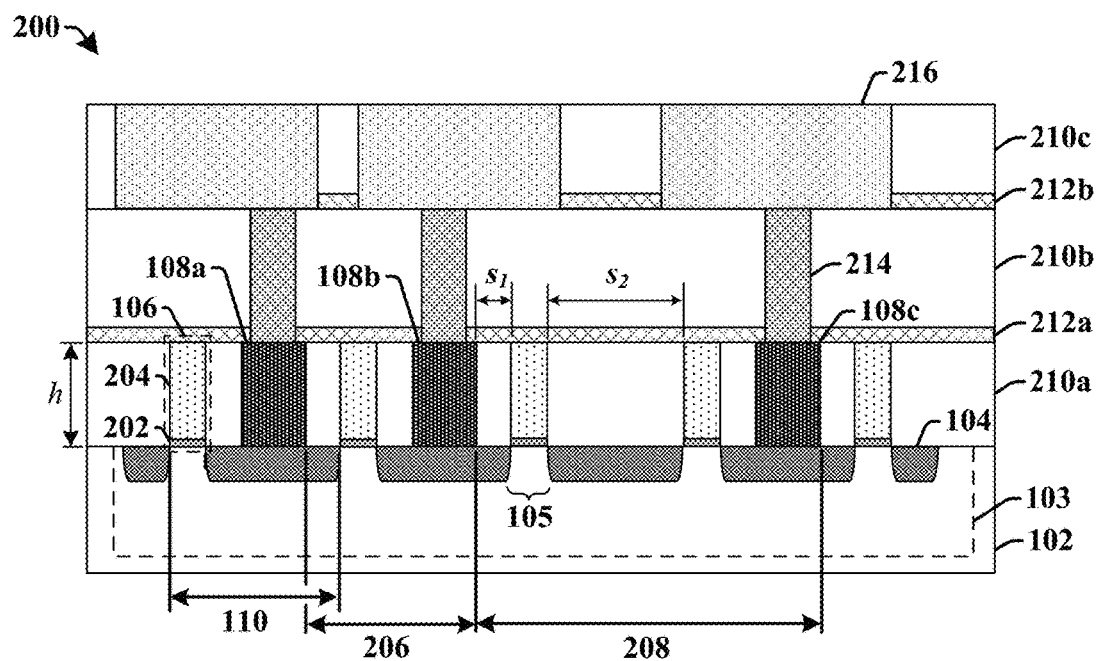
FIG. 2 illustrates a cross-sectional view of some embodiments of a substrate having a MOL layer that is arranged at an irregular pitch to reduce parasitic capacitance.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Moreover, it will be appreciated that the fill and colors used in the illustrated layers are similar throughout the disclosure (e.g., the fill and color used in the layers shown in FIG. 2 are similar to the fill and colors used in the layers shown in FIGS. 3A-3B).

In emerging technology nodes the small size of transistor components may cause restrictive topology choices for back-end-of-the-line (BEOL) metal layer routing. To alleviate the metal line routing problems, middle-of-the-line (MOL) local interconnection layers may be used. MOL local interconnect layers are conductive metal layers that are vertically positioned between the front-end-of-line (FEOL) and the BEOL. MOL local interconnect layers can provide very high-density local routing that avoids consumption of scarce routing resources on the lower BEOL metal layers.

Typically, MOL local interconnect layers comprise MOL structures that are formed over a well region at a constant (i.e., regular) pitch to improve a lithographic process window. Conductive contacts are subsequently formed onto some of the MOL structures that are needed in a design to form an electrical connection with overlying metal wire layers. This results in dummy MOL structures, which are the MOL structures that have no electrical connection to overlying metal wire layers. It has been appreciated that in emerging technology nodes (e.g., 14 nm, 10 nm, 7 nm, etc.) the small size between MOL structures and gate structures is becoming small enough to produce a parasitic capacitance that significantly degrades transistor device performance.

The present disclosure relates to a method of forming an integrated chip that removes unnecessary MOL dummy structures to reduce parasitic capacitance and to form MOL structures at an irregular pitch, and an associated apparatus. In some embodiments, the integrated chip comprises a well region comprising a plurality of source/drain regions. A plurality of gate structures are arranged over the well region at a regular pitch. A plurality of middle-of-the-line (MOL) structures are laterally interleaved between some of the plurality of gate structures and are arranged over the well region at an irregular pitch comprising a first pitch that is larger than the regular pitch. By having the MOL structures arranged at an irregular pitch that comprises a first pitch that is larger than the regular pitch, one or more of the plurality of gate structures are spaced apart from a closest gate or MOL structure by a relatively large space that provides for a relatively low parasitic capacitance.

FIG. 1 illustrates three-dimensional view of some embodiments of an integrated chip 100 having a middle-of-the-line (MOL) layer arranged at an irregular pitch to reduce parasitic capacitance.

The integrated chip 100 comprises a well region 103 comprising a plurality of source/drain regions 104 (to simplify the illustration, a single source/drain region 104 is labeled with a reference numeral in FIG. 1.) arranged within the semiconductor substrate 102 along a first direction 116. In some embodiments, the well region 103 may have a doping type opposite the source/drain regions 104 (e.g., a PMOS active area formed within a p-type substrate may comprise p-type source/drain regions arranged within an n-type well region 103). The plurality of source/drain regions 104 comprise highly doped regions (e.g., having a doping concentration greater than that of the surrounding semiconductor substrate 102) that are laterally separated by channel regions 105. A plurality of gate structures 106 are arranged over the channel regions 105 and extend over the well region 103 along a second direction 118 that is perpendicular to the first direction 116. The plurality of gate structures 106 are arranged in a repeating pattern that extends along the first direction 116. Within the repeating pattern, the plurality of gate structures 106 are arranged at a regular pitch 110 (i.e., a spacing is substantially the same between left edges of the gate structures or between right edges of the gate structure).

A plurality of middle-of-the-line (MOL) structures 108 are arranged over the well region 103 at locations between adjacent ones of the plurality of gate structures 106. The plurality of MOL structures 108 are in electrical contact with the source/drain regions 104 and are configured to provide for lateral routing (e.g., in the first direction 116 and/or the second direction 118) between the source/drain regions 104 and an overlying conductive contact (not shown). Two or more of the plurality of MOL structures 108 are arranged over the well region 103 at a pitch 112 larger than the regular pitch 110.

Since the pitch 112 is larger than the regular pitch 110, at least two adjacent ones of the plurality of MOL structures 108 are laterally separated by a second distance greater than the regular pitch. However, since the plurality of gate structures 106 are arranged at the regular pitch, this means that some of the plurality of gate structures 106 are not separated by an intervening MOL structure. By having some of the plurality of gate structures 106 not separated by a MOL structure 108, the parasitic capacitance on the gate structures 106 is reduced. Reducing the parasitic capacitance (e.g., an unwanted capacitance between conductive components because of their proximity to one another) on the gate structures 106 improves performance of transistors associated with the gate structures 106.

It will be appreciated that the term "regular pitch", as used herein, means a substantially regular pitch within tolerances due to misalignment errors. For example, the regular pitch may have values between different pairs of gate structures that vary due to misalignment errors by approximately 5% (e.g., a first pitch Pa of a first pair of gate structures may be between 0.95 and 1.05 times a second pitch Pb of a second pair of gate structures).

FIG. 2 illustrates a cross-sectional view of some embodiments of an integrated chip 200 having MOL structures arranged at an irregular pitch. With respect to the embodiment of FIG. 1, like elements in the cross-sectional view 200 are designated with the same reference numbers for ease of understanding.

The integrated chip 200 comprises a well region 103 arranged within a semiconductor substrate 102. The well region 103 comprises a plurality of source/drain regions 104 that are laterally separated by channel regions 105. A plurality of gate structures 106 are arranged over the channel regions 105 at a regular pitch 110. In some embodiments, the plurality of gate structures 106 may respectively comprise a gate electrode 204 separated from the semiconductor substrate 102 by way of a gate dielectric 202. In various embodiments, the gate electrode 204 may comprise polysilicon or a metal (e.g., aluminum). In various embodiments, the gate dielectric 202 may comprise an oxide (e.g., silicon dioxide) or a high-k material.

A plurality of MOL structures 108 are arranged over source/drain regions 104 at a location laterally adjacent to the gate structures 106. The plurality of MOL structures 108 may contact the underlying semiconductor substrate 102. In various embodiments, the plurality of MOL structures 108 may comprise a conductive metal (e.g., tungsten, copper, cobalt, etc.). In some embodiments, the plurality of gate structures 106 and the plurality of MOL structures 108 may have an approximately same height h.

The plurality of MOL structures 108 are arranged at an irregular pitch having more than one pitch. For example, a first MOL structure 108a and a second MOL structure 108b may be arranged at a first pitch 206, while the second MOL structure 108b and a third MOL structure 108c may be arranged at a second pitch 208 that is different than the first pitch 206. The irregular pitch causes different ones of the plurality of MOL structures 108 to be separated from an adjacent one of the plurality of MOL structures 108 by different spaces, and also causes a gate structure 106 to be separated from adjacent MOL or gate structures by different spaces. For example, a gate structure 106 may have a first side separated from a neighboring MOL structure 108 by a first distance $s_1$ and an opposite second side that is separated from an adjacent gate structure 106 by a second distance $s_2$ that is larger than the first distance $s_1$. Since capacitance (C) is inversely proportional to a distance (d) between conductive elements (e.g., $C \propto 1/d$), the larger second distance $s_2$ reduces the parasitic capacitance on the gate structures 106 and improves performance of transistors associated with the gate structures 106.

The irregular pitch also causes one or more of the plurality of gate structures 106 to laterally neighbor a MOL structure 108 and a gate structure 106 on opposing sides. In other words, the one or more MOL structures 108 are laterally interleaved between a subset of the plurality of gate structures 106, so that the plurality of gate structures 106 and the one or more MOL structures 108 are arranged over the well region 103 in a pattern in which two or more of the plurality of gate structures 106 neighbor each other (i.e., are not separated by an interleaved MOL structure 108).

A first inter-level dielectric (ILD) layer 210a is arranged over the semiconductor substrate 102 at locations laterally between the plurality of gate structures 106 and the plurality of MOL structures 108. A second ILD layer 210b is arranged over the first ILD layer 210a. A plurality of conductive contacts 214 are arranged within the second ILD layer 210b at locations over the plurality of MOL structures 108. The plurality of conductive contacts 214 are configured to electrically couple the plurality of MOL structures 108 to an overlying metal wire layer 216 arranged within a third ILD layer 210c overlying the second ILD layer 210b. In some embodiments, the first ILD layer 210a may be vertically separated from the second ILD layer 210b by a first etch stop layer 212a, and the second ILD layer 210b may be vertically separated from the third ILD layer 212c by a second etch stop layer 212b.

In some embodiments, the conductive contacts 214 may comprise tungsten and the overlying metal wire layer 216 may comprise copper. In some embodiments, all of the plurality of MOL structures 108 over the well region 103 are electrically coupled to a conductive contact 214. In various embodiments, the ILD layers 210a-210c may comprise a low-k dielectric layer, an ultra low-k dielectric layer, an extreme low-k dielectric layer, and/or a silicon dioxide layer. In various embodiments, the etch stop layers 212a-212b may comprise a nitride, such as silicon nitride, for example.

Figure 3A:
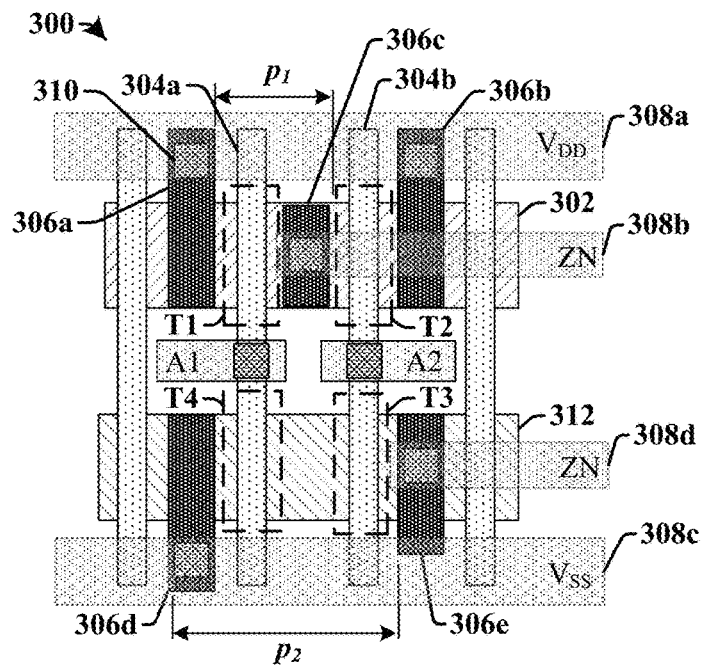
FIGS. 3A-3B illustrates some embodiments of a NAND gate having a MOL layer that is arranged at an irregular pitch.
Figure 3B:
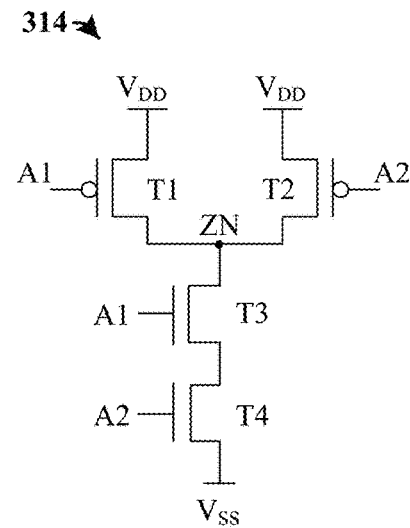

FIG. 3A illustrates a top-view 300 of some embodiments of a NAND gate having a MOL layer arranged at an irregular pitch. FIG. 3B illustrates a corresponding schematic diagram 314 of the NAND gate of FIG. 3A.

As shown in top-view 300, the NAND gate comprises a first well region 302 and a second well region 312. The first well region 302 comprises a plurality of source/drain regions having p-type dopants. The second well region 312 comprises a plurality of source/drain regions having n-type dopants.

A first gate structure 304a and a second gate structure 304b extend over the first well region 302 to form a first PMOS transistor T1 and a second PMOS transistor T2 arranged in parallel between a node ZN and a source voltage $V_{DD}$. A first plurality of MOL structures 306a-306c are arranged over the first well region 302 at a first pitch $p_1$ that causes the gate structures 304a-304b to be separated from the first plurality of MOL structures 306a-306c on opposing sides by an equal space.

The first plurality of MOL structures comprise a first MOL structure 306a, a second MOL structure 306b, and a third MOL structure 306c. The first MOL structure 306a and the second MOL structure 306b extend from over the first well region 302 to under a first metal wire structure 308a (illustrated as transparent to show the underlying layers). The first MOL structure 306a and the second MOL structure 306b are connected to the first metal wire structure 308a by way of conductive contacts 310 (to simplify the illustration, a single conductive contact 310 is labeled with a reference numeral in FIGS. 3A-3B). The third MOL structure 306c is connected to a second metal wire structure 308b by a conductive contact 310.

The first gate structure 304a and the second gate structure 304b also extend over the second well region 312 to form a first NMOS transistor T3 and a second NMOS transistor T4 arranged in series between node ZN and a ground voltage $V_{SS}$. A second plurality of MOL structures 306d-306e are arranged over the second well region 312 at a second pitch $p_2$ that is greater than the first pitch $p_1$, and which causes the gate structures 304a-304b to be separated from the second plurality of MOL structures 306d-306e on opposing sides by unequal spaces.

The second plurality of MOL structures 306d-306e comprise a fourth MOL structure 306d and a fifth MOL structure 306e. The fourth MOL structure 306d extends from over the second well region 312 to under a third overlying metal wire structure 308c and is connected to the third overlying metal wire structure 308c by way of a conductive contact 310. The fifth MOL structure 306e is connected to a fourth overlying metal wire structure 308d by a conductive contact 310.

Figure 4A:
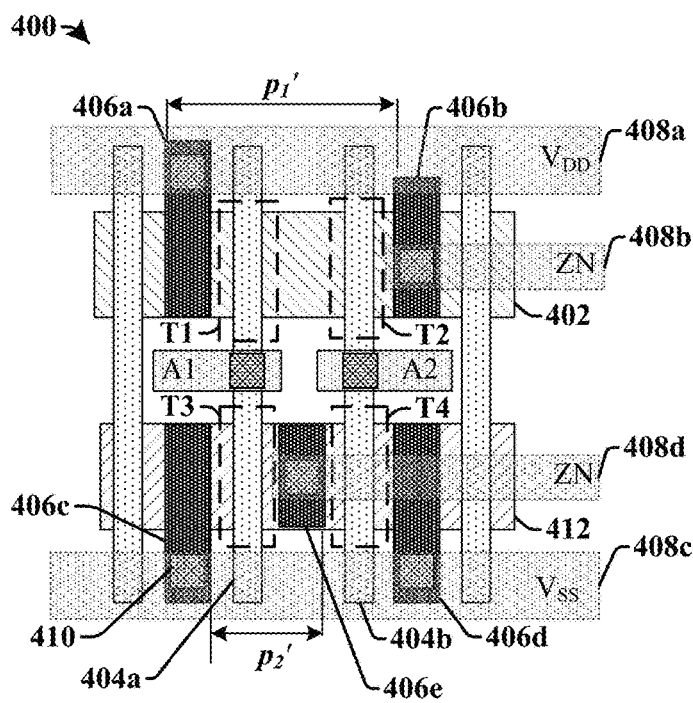
FIGS. 4A-4B illustrates some embodiments of a NOR gate having a MOL layer that is arranged at an irregular pitch.
Figure 4B:
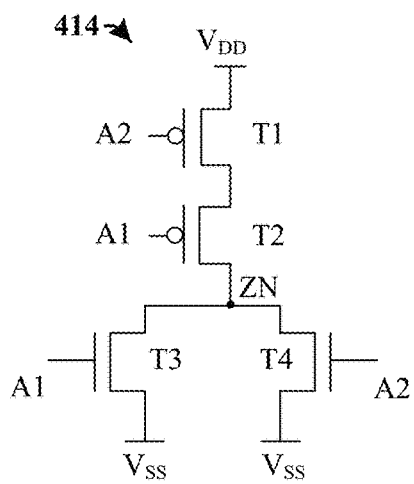

FIG. 4A illustrates a top-view 400 of some embodiments of a NOR gate having a MOL layer arranged at an irregular pitch. FIG. 4B illustrates a corresponding schematic diagram 414 of the NOR gate of FIG. 4A.

As shown in top-view 400, the NOR gate comprises a first well region 402 and a second well region 412. The first well region 402 comprises a plurality of source/drain regions having n-type dopants. The second well region 412 comprises a plurality of source/drain regions having p-type dopants.

A first gate structure 404a and a second gate structure 404b extend over the first well region 402 to form a first PMOS transistor T1 and a second PMOS transistor T2 arranged in series between a node ZN and a source voltage $V_{DD}$. A first plurality of MOL structures 406a-406b are arranged over the first well region 402 at a first pitch $p_1'$ that causes the gate structures 404a-404b to be separated from the first plurality of MOL structures 406a-406b on opposing sides by unequal spaces.

The first plurality of MOL structures comprise a first MOL structure 406a and a second MOL structure 406b. The first MOL structure 406a extends from over the first well region 402 to under a first metal wire structure 408a (illustrated as transparent to show the underlying layers). The first MOL structure 406a is connected to the first metal wire structure 408a by a conductive contact 410 (to simplify the illustration, a single conductive contact 410 is labeled with a reference numeral in FIGS. 3A-3B). The second MOL structure 406b is connected to a second metal wire structure 408b by way of a conductive contact 410.

The first gate structure 404a and the second gate structure 404b also extend over the second well region 412 to form a first NMOS transistor T3 and a second NMOS transistor T4 arranged in parallel between node ZN and a ground voltage $V_{SS}$. A second plurality of MOL structures 406c-406e are arranged over the second well region 412 at a second pitch $p_2'$ that is less than the first pitch $p_1'$, and which causes the gate structures 404a-404b to be separated from the second plurality of MOL structures 406c-406e on opposing sides by an equal space.

The second plurality of MOL structures 406c-406e comprise a third MOL structure 406c, a fourth MOL structure 406d, and a fifth MOL structure 406e. The third MOL structure 406c and the fourth MOL structure 406d extend from over the second well region 412 to under a third overlying metal wire 408c and are connected to the third MOL structure 406c by way of conductive contacts 410. The fifth MOL structure 406e is connected to a fourth overlying metal wire structure 408d by a conductive contact 410.

Figure 5:
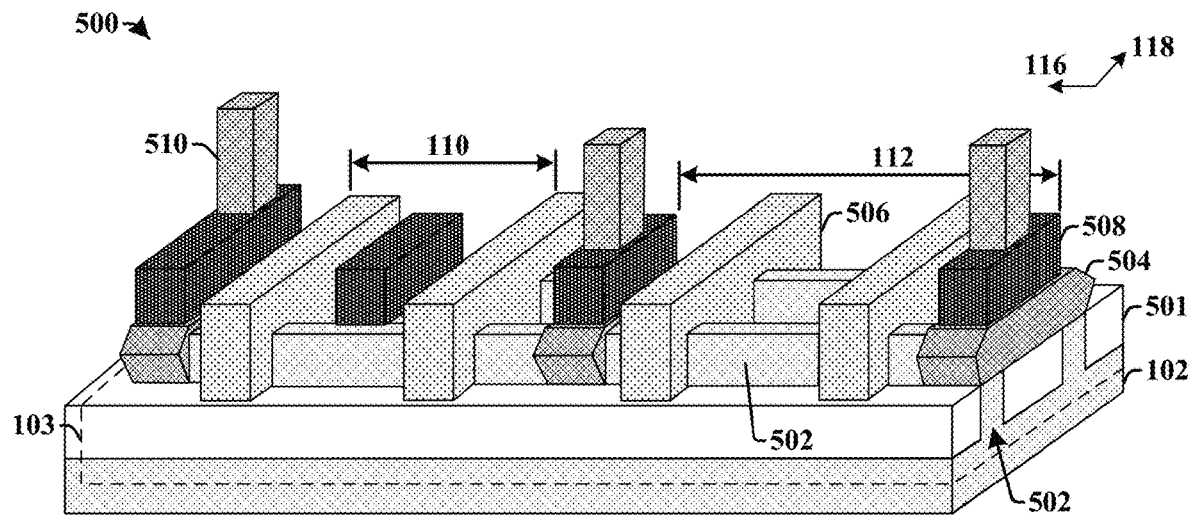
FIG. 5 illustrates a three-dimensional view of some embodiments of a substrate having a MOL layer arranged at an irregular pitch between gate structures within FinFET devices.

It has been appreciated that the use of a MOL layer having an irregular pitch may be especially useful in multi-gate device (e.g., double gate FinFETs, tri-gate FinFETs, omega FET, Gate all around (GAA), vertical GAA, etc.). FIG. 5 illustrates three-dimensional view of some embodiments of an integrated chip 500 having a MOL layer arranged at an irregular pitch between gate structures of multi-gate devices (e.g., a FinFET devices). Elements in the three-dimensional view of FIG. 5 that are described in previous embodiments have been designated with the same reference numbers for ease of understanding.

The integrated chip 500 comprises a plurality of fins of semiconductor material 502 protruding outward from a semiconductor substrate 102 (e.g., from a well region 103 doped opposite the semiconductor substrate 102) and extending along a first direction 116. The plurality of fins of semiconductor material 502 extend between epitaxial source/drain regions 504 (to simplify the illustration, a single source/drain region 504 is labeled with a reference numeral in FIG. 5). The epitaxial source/drain regions 504 are shared between adjacent fins of semiconductor material 502 (e.g., so that a same epitaxial source/drain region 504 extends between a first fin and a second fin). The epitaxial source/drain regions 504 are arranged on the fins of semiconductor material 502 and comprise highly doped regions of semiconductor material (e.g., having a doping concentration greater than that of the semiconductor substrate 102), so that a channel region may be formed within the plurality of fins of semiconductor material 502. In some embodiments, the plurality of fins of semiconductor material 502 may be laterally separated by an isolation layer 501 (e.g., comprising STI regions).

A plurality of gate structures 506 are arranged over the plurality of fins of semiconductor material 502 along a second direction 118 that is perpendicular to the first direction 116 (to simplify the illustration, a single gate structure 506 is labeled with a reference numeral in FIG. 5). The plurality of gate structures 506 are arranged in a repeating pattern that extends along the first direction 116. Within the repeating pattern, the plurality of gate structures 506 are arranged at a regular pitch 110.

A plurality of middle-of-the-line (MOL) structures 508 are arranged over the plurality of fins of semiconductor material 502 at locations between adjacent ones of the plurality of gate structures 506 (to simplify the illustration, a single MOL structure 508 is labeled with a reference numeral in FIG. 5). In some embodiments, the plurality of MOL structures 508 may be arranged onto an insulating layer (not shown) surrounding the plurality of fins of semiconductor material 502. The plurality of MOL structures 508 are in electrical contact with the plurality of source/drain regions 504 and are configured to provide for lateral routing to an overlying conductive contact 510 (to simplify the illustration, a single conductive contact 510 is labeled with a reference numeral in FIG. 5). Two or more of the plurality of MOL structures 508 are arranged at a pitch 112 larger than the regular pitch 110.

Figures 6A, 6B:
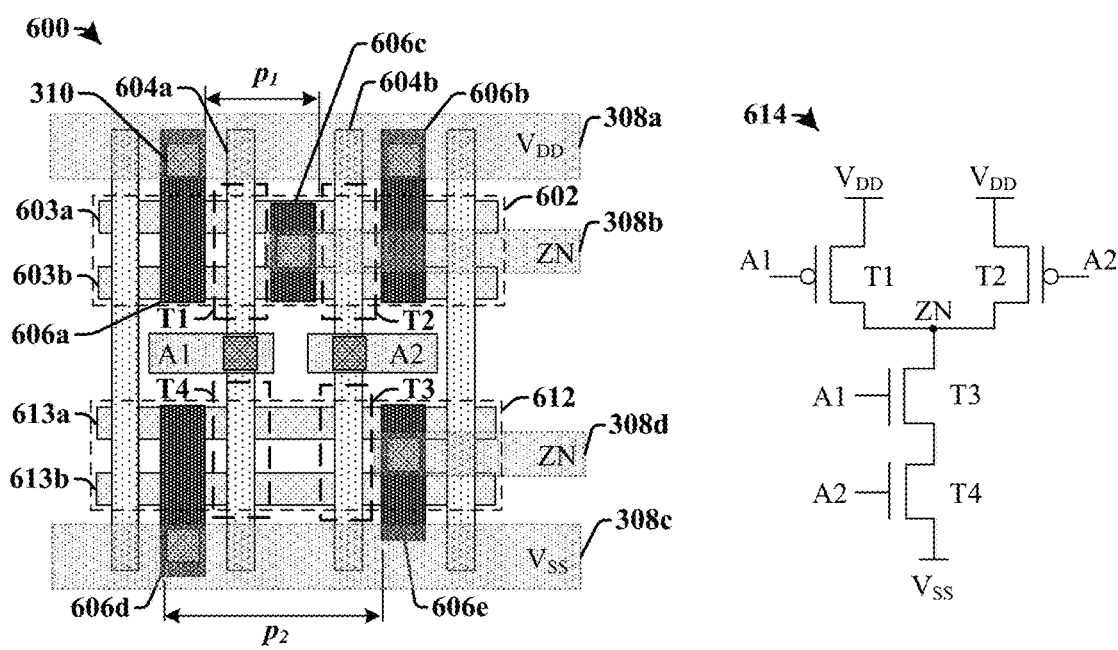
FIGS. 6A-6B illustrates some embodiments of a NAND gate having a MOL layer that is arranged at an irregular pitch between gate structures within FinFET devices.

FIG. 6A illustrates a top-view 600 of some embodiments of a NAND gate having a MOL layer arranged at an irregular pitch between gate structures within FinFET devices. FIG. 6B illustrates a corresponding schematic diagram 614 of the NAND gate of FIG. 6A.

As shown in top-view 600, the NAND gate comprises a first well region 602 and a second well region 612. The first well region 602 comprises first and second fins of semiconductor material, 603a and 603b, arranged between source and drain regions (not shown) having p-type dopants. The second well region 612 comprises first and second fins of semiconductor material, 613a and 613b, arranged between source and drain regions (not shown) having n-type dopants.

A first gate structure 604a and a second gate structure 604b extend over the first well region 602 to form a first PMOS transistor T1 and a second PMOS transistor T2 arranged in parallel between a node ZN and a source voltage $V_{DD}$. A first plurality of MOL structures 606a-606c are arranged over the first well region 602 at a first pitch $p_1$ that causes the gate structures 604a-604b to be separated from MOL structures 606a-606c on opposing sides by an equal space. The first gate structure 604a and the second gate structure 604b also extend over the second well region 612 to form a first NMOS transistor T3 and a second NMOS transistor T4 arranged in series between node ZN and a ground voltage $V_{SS}$. A second plurality of MOL structures 606d-606e are arranged over the second well region 612 at a second pitch $p_2$ that is greater than the first pitch $p_1$, and which causes the gate structures 604a-604b to be separated from MOL structures 606d-606e on opposing sides by unequal spaces.

FIGS. 7-11 illustrates top-views and corresponding cross-sectional views corresponding to some embodiments of a method of forming an integrated chip that reduces parasitic capacitance by removing unnecessary MOL dummy structures. It will be appreciated that elements in FIGS. 7-11 that have been described in previous embodiments have been designated with the same reference numbers for ease of understanding. Furthermore, to simplify the illustrations, elements shown multiple times within a figure are labeled with a reference numeral a single time (e.g., although multiple gate structures are shown in FIGS. 7-11, a single gate structure 106 is labeled).

Figure 7:
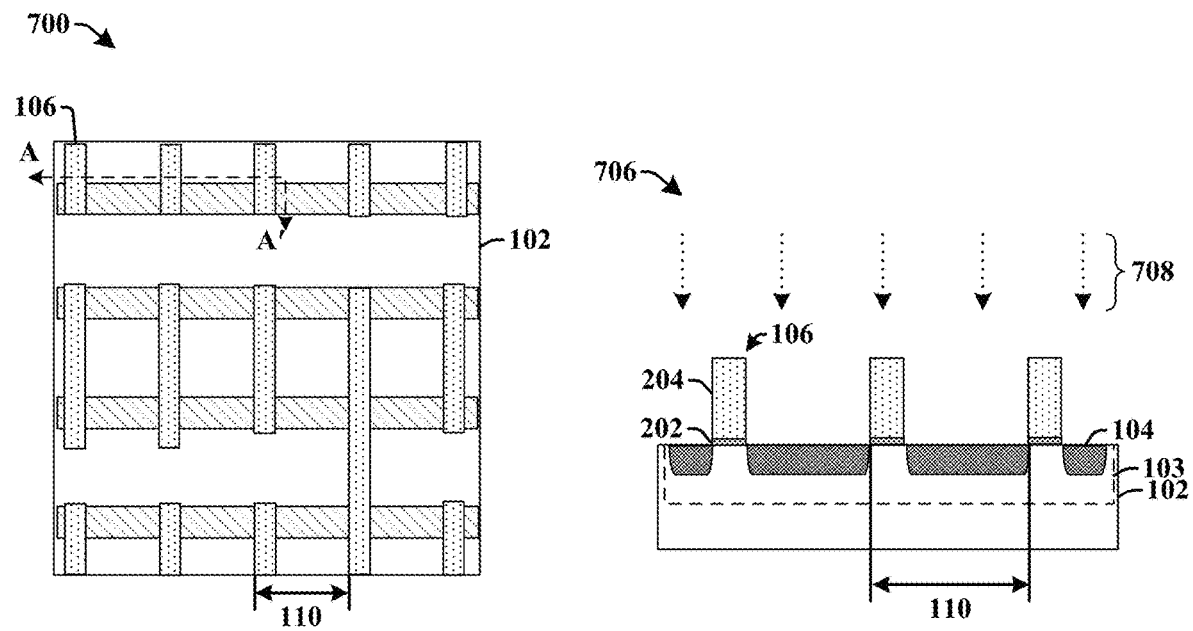
FIGS. 7-11 illustrate top-views and cross-sectional views corresponding to some embodiments of a method of forming an integrated chip having a MOL layer arranged at an irregular pitch.

As shown in top-view 700 and cross-sectional view 706 of FIG. 7 a plurality of gate structures 106 are formed over a semiconductor substrate 102 at a regular pitch 110. The plurality of gate structures 106 comprise a gate electrode 204 separated from the semiconductor substrate 102 by a gate dielectric layer 202. An well region 103 comprising a plurality of source/drain regions 104 is also formed within the semiconductor substrate 102. In some embodiments, the well region 103 (within which the source/drain regions 104 are disposed) is formed prior to the formation of the plurality of gate structures 106. The well region may be formed by selectively implanting a dopant species into the semiconductor substrate 103 (e.g., an n-well may be formed within a p-type substrate, to form a PMOS active area, by implanting a p-type dopant into the substrate prior to the formation of the gate structures).

In various embodiments, the semiconductor substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the plurality of gate structures 106 may be formed by forming a gate dielectric layer over the semiconductor substrate 102, and subsequently forming a gate electrode layer over the gate dielectric layer. The gate dielectric layer and the gate electrode layer are subsequently patterned according to photolithography process to form a plurality of gate structures 106.

In some embodiments, the plurality of source/drain regions 104 may be formed by an implantation process that implants a dopant species 708 into the semiconductor substrate 102. In various embodiments, the dopant species 708 may comprise a p-type dopant (e.g., boron, gallium, etc.) or an n-type dopant (e.g., phosphorus, arsenic, etc.). In some embodiments, the dopant species 708 may be driven into the semiconductor substrate 102 by performing a subsequent high-temperature anneal. In some alternative embodiments, the source/drain regions 104 may be formed by an epitaxial growth process at a location within or overlying the semiconductor substrate 102.

Figure 8:
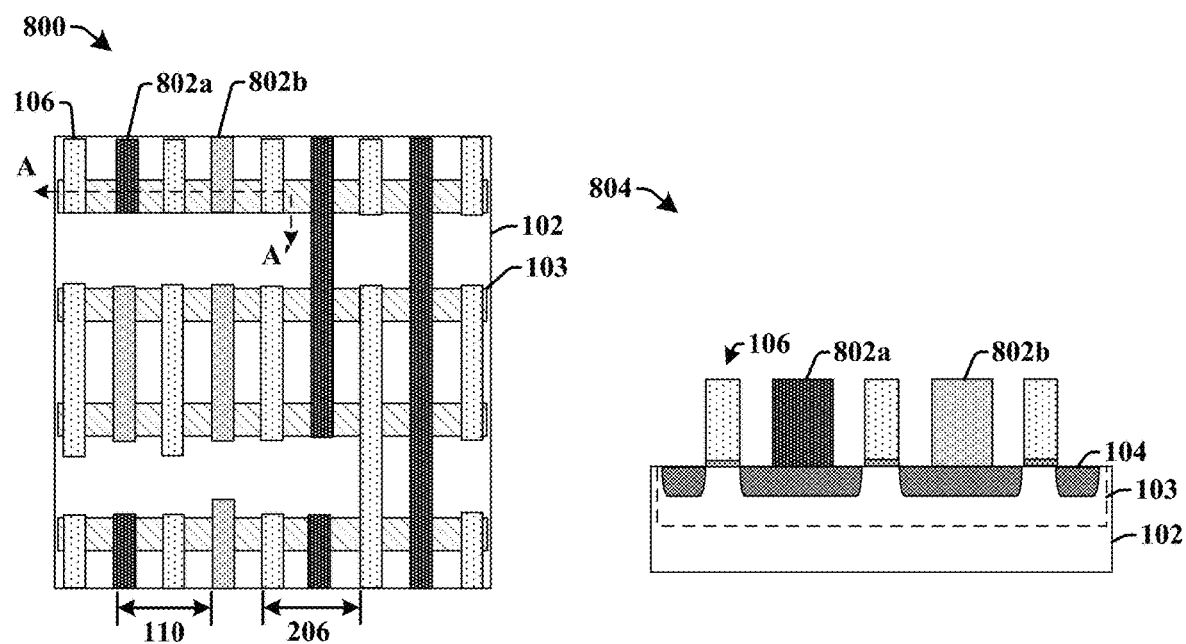

As shown in top-view 800 and cross-sectional view 804 of FIG. 8, a plurality of MOL structures, 802a and 802b, are formed over the semiconductor substrate 102 at locations laterally interleaved between the plurality of gate structures 106. The plurality of MOL structures comprise MOL active structures 802a (i.e., MOL structures that are subsequently connected to an overlying conductive contact within an electrical path) and MOL dummy structures 802b (i.e., electrically inactive MOL structures that are not subsequently connected to an overlying conductive contact). The plurality of MOL structures, 802a and 802b, are arranged at a first pitch 206. In some embodiments, the regular pitch 110 and the first pitch 206 are substantially equal.

Figure 9:
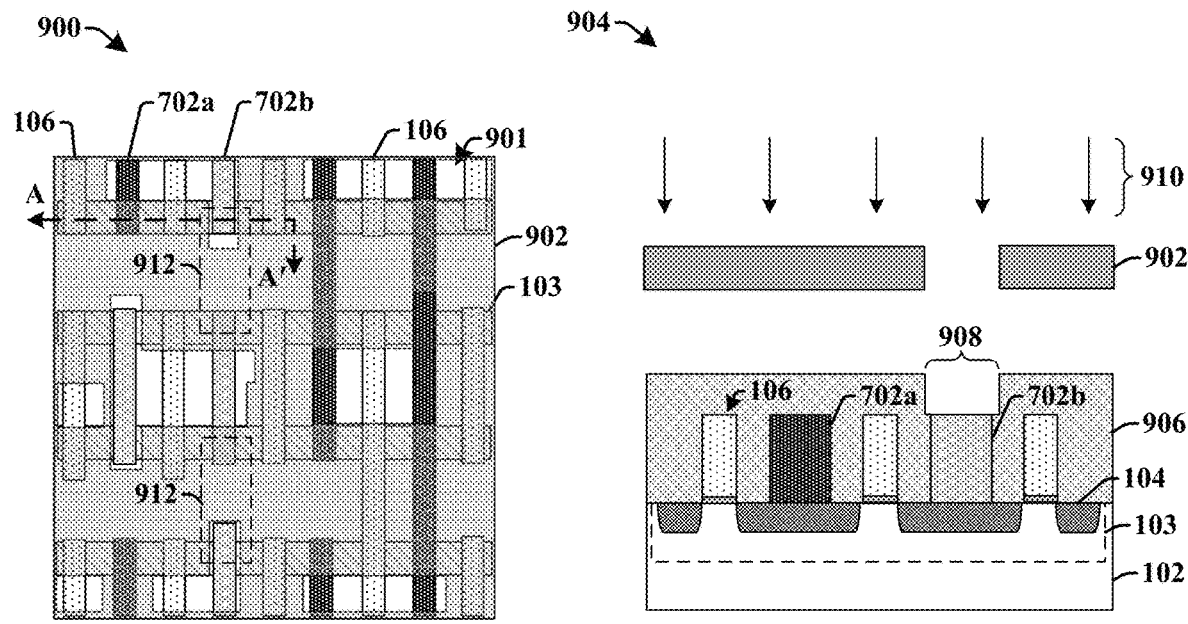

As shown in top-view 900 and cross-sectional view 904 of FIG. 9, a cut mask 902 is used in a patterning process that selectively removes parts of the MOL structures, 802a and/or 802b. In some embodiments, the patterning process patterns a masking layer 906 overlying the semiconductor substrate 102 to form openings 908 within the masking layer 906 that arranged over the MOL dummy structures 802b. In some embodiments, the masking layer 906 may comprise a photoresist layer. In such embodiments, the masking layer 906 may be patterned by selectively exposing the masking layer 906 to radiation 910 according to the cut mask 902, and subsequently developing the masking layer 906 to form the openings 908.

In some embodiments, the location of cut regions 901 within the cut mask 902 may be limited by design rules. For example, in some embodiments, the cut mask 902 may not be able to remove MOL dummy structures 802b that are separated by an insufficient spacing (e.g., if the spacing between edges of the cuts is smaller than that allowed by design rules). In such embodiments, the cut mask 902 may be configured to remove a part of a MOL dummy structure 802b that is allowed by design rules. For example, as shown in boxes 912 of top-view 900, MOL dummy structures 802b are aligned so that the cut mask 902 would have cuts that are separated by a space that is smaller than that allowed by design rules. Therefore, a part of the MOL dummy structures 802b is removed, and a reminder of the MOL dummy structures 802b is left. By removing a part of the MOL dummy structures 802b, the parasitic capacitance of the design is reduced without violating design rules that may lead to high cost mask construction.

Figure 10:
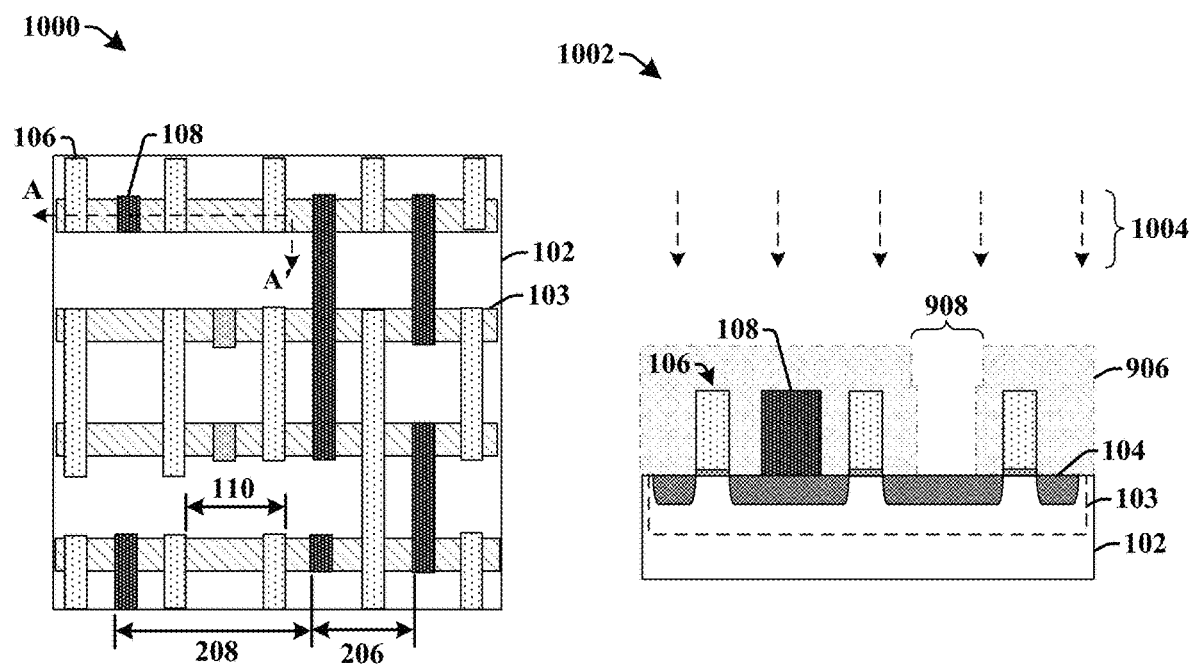

As shown in top-view 1000 and cross-sectional view 1002 of FIG. 10, an etching process is used to selectively remove the MOL dummy structures 802b according to the openings 908 in the masking layer 906. The etching process exposes the MOL dummy structures 802b underlying the openings 908 to an etchant 1004, which selectively cuts or trims the MOL dummy structures 802b over some parts of the well region 103. In some embodiments, the etchant 1004 may be selective to a material of the MOL structures, 802a and 802b, so that the gate structure 106 is not cut. In various embodiments, the etchant 1004 may comprise a dry etchant (e.g., a plasma etch with tetrafluoromethane ($CF_4$), sulfur hexafluoride ($SF_6$), nitrogen trifluoride ($NF_3$), etc.) or a wet etchant (e.g., hydroflouric (HF) acid).

The etching process causes the plurality of MOL structures, 802a and 802b, overlying the well region 103 to have an irregular pitch. The irregular pitch causes some of the plurality of MOL structures, 802a and 802b, to be arranged at the first pitch 206, while others of the plurality of MOL structures, 802a and 802b, are arranged at a second pitch 208 that is larger than the first pitch 206.

While FIGS. 9-10 illustrate the use of a 'cut last' technique that cuts the MOL dummy structures 802b, it will be appreciated that other cut techniques may be used. For example, in some alternative embodiments, a 'cut first' technique may be used to form a material on cut regions so that the MOL dummy structures 802b will be excluded from being formed in the cut regions.

Figure 11:
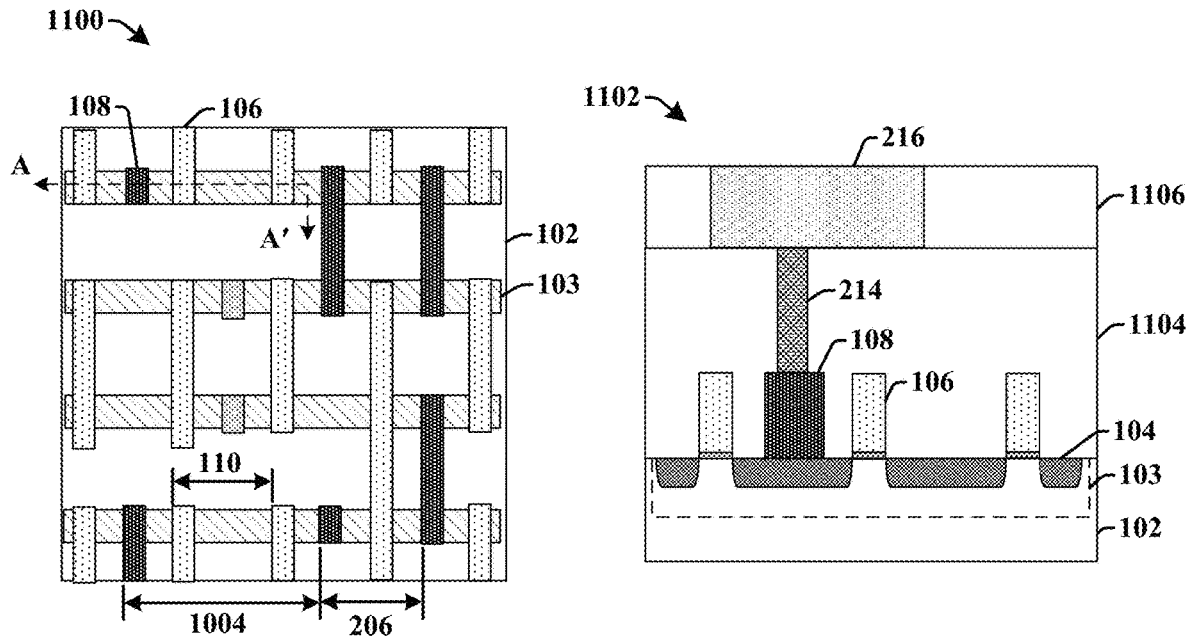

As shown in cross-sectional view 1100 and cross-sectional view 1102 of FIG. 11, an ILD layer 1104 is formed over the semiconductor substrate 102. The ILD layer 1104 laterally separates the gate structures 106 and the MOL structures 108. Conductive contacts 214 are subsequently formed in the ILD layer 1104. The conductive contacts 214 electrically connect the MOL structures 108 to an overlying metal wire layer 216 arranged in an overlying ILD layer 1106.

In some embodiments, the ILD layer 1104 may be deposited over the semiconductor substrate 102 by way of vapor deposition techniques (e.g., physical vapor deposition, chemical vapor deposition, etc.). The ILD layer 1104 is selectively etched to form a contact hole extending from an upper surface of the ILD layer 1104 and the MOL structure 108. The contact hole is then filled with a metal (e.g., tungsten), and a first planarization process is performed to form a conductive contact 214. In some embodiments, the overlying metal wire layer 216 may be formed by depositing the overlying ILD layer 1106 over the ILD layer 1104 using a vapor deposition process. The overlying ILD layer 1106 is selectively etched to form a trench, which is subsequently filled with a metal (e.g., copper). A second planarization process may be subsequently performed to form the overlying metal wire layer 216.

Figure 12:
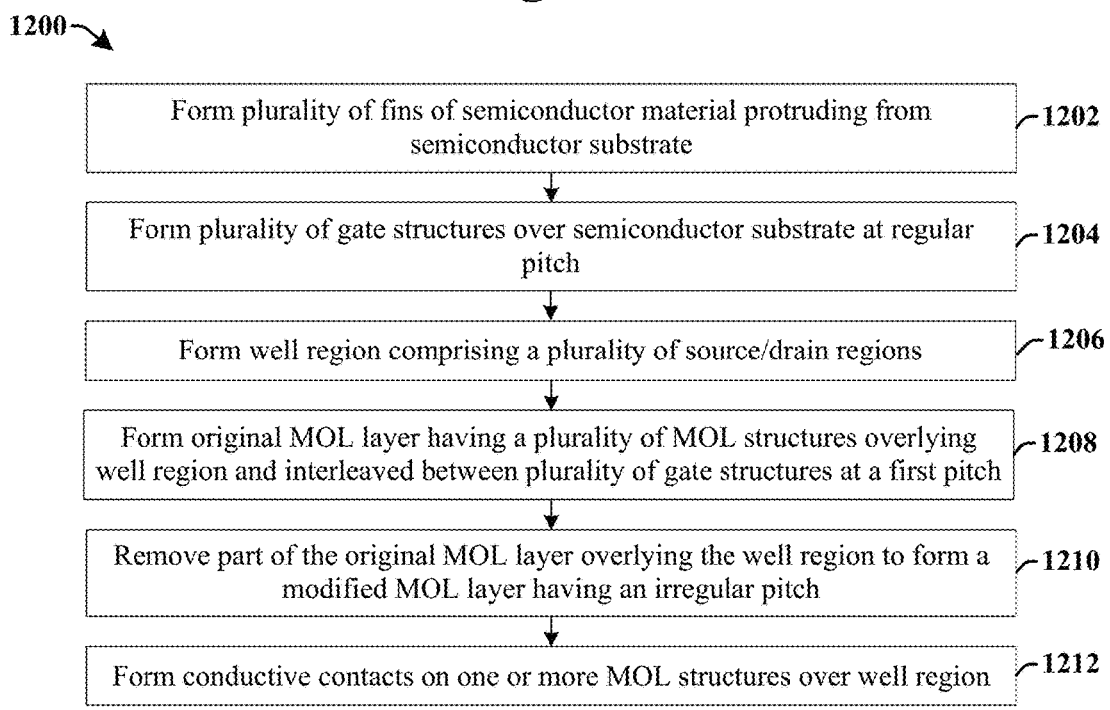
FIG. 12 illustrates a flow diagram of some embodiments of a method of forming an integrated chip having a MOL layer arranged at an irregular pitch.

FIG. 12 illustrates a flow diagram of some embodiments of a method 1200 of forming an integrated chip that reduces parasitic capacitance by removing unnecessary MOL dummy structures to form MOL structures at an irregular pitch.

While the disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, a plurality of fins of semiconductor material may be formed to protrude from a semiconductor substrate in some embodiments.

At 1204, a plurality of gate structures are formed over the semiconductor substrate at a regular pitch. In some embodiments, the plurality of gate structures may be formed over the plurality of fins of semiconductor material. In other embodiments, the plurality of gate structures may be formed on a planar surface of the semiconductor substrate. FIG. 7 illustrates some embodiments corresponding to act 1204.

At 1206, a well region is formed. The well region comprises a plurality of source/drain regions. The well region may extend along a direction that intersects the plurality of gate structures. FIG. 7 illustrates some embodiments corresponding to act 1206.

At 1208, an original MOL layer is formed having a plurality of MOL structures overlying the well region and interleaved between the plurality of gate structures at a first pitch. FIG. 8 illustrates some embodiments corresponding to act 1208.

At 1210, part of the original MOL layer overlying the well region is removed to form a modified MOL layer having an irregular pitch. The irregular pitch may comprise the first pitch, and a second pitch that is larger than the first pitch. FIGS. 9-10 illustrate some embodiments corresponding to act 1210.

At 1212, conductive contacts are formed on one or more MOL structures overlying the well region. FIG. 11 illustrates some embodiments corresponding to act 1212.

Therefore, the present disclosure relates to a method of forming integrated chip that reduces parasitic capacitance by removing unnecessary MOL dummy structures to form MOL structures at an irregular pitch, and an associated apparatus.

In some embodiments, the present disclosure relates to an integrated chip. The integrated chip comprises a well region comprising a plurality of source/drain regions, and a plurality of gate structures arranged over the well region at a substantially regular pitch. The integrated chip comprises a plurality of middle-of-the-line (MOL) structures laterally interleaved between some of the plurality of gate structures and arranged over the well region at an irregular pitch comprising a first pitch that is larger than the substantially regular pitch.

In other embodiments, the present disclosure relates to an integrated chip. The integrated chip comprises a well region having a plurality of source/drain regions. The integrated chip further comprises a plurality of gate structures arranged over the well region and laterally separated from one another by a first distance, and a plurality of middle-of-the-line (MOL) structures arranged over the well region at positions laterally interleaved between two of the plurality of gate structures. At least two adjacent ones of the plurality of MOL structures are laterally separated by a second distance greater than the first distance.

In yet other embodiments, the present disclosure relates to a method of forming an integrated chip. The method comprises forming a plurality of gate structures over a semiconductor substrate, and forming a well region comprising a plurality of source/drain regions, wherein the well region underlies the plurality of gate structures. The method further comprises forming an original middle-of-the-line (MOL) layer having a plurality of MOL structures laterally interleaved between the plurality of gate structures and overlying the well region. The method further comprises removing a part of the original MOL layer overlying the well region to form a modified MOL layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a plurality of gate structures over a substrate;
   forming a plurality of source and drain regions along opposing sides of the plurality of gate structures;
   defining a plurality of middle-of-the-line (MOL) structures at locations laterally interleaved between the plurality of gate structures;
   redefining the plurality of MOL structures by getting rid of a part but not all of one or more of the plurality of MOL structures, wherein redefining the plurality of MOL structures results in a plurality of MOL active structures arranged over the plurality of source and drain regions at an irregular pitch and a plurality of MOL dummy structures arranged over the plurality of source and drain regions, the plurality of MOL dummy structures not configured to be subsequently connected to an overlying conductive interconnect; and
   wherein the plurality of MOL dummy structures comprise a first MOL dummy structure having a first length and the plurality of MOL active structures comprise a first MOL active structure having a second length greater than the first length.

2. The method of claim 1,
   wherein the plurality of MOL structures are defined according to a first photomask; and
   wherein the plurality of MOL structures are redefined according to a cut mask.

3. The method of claim 1, wherein redefining the plurality of MOL structures forms two separate MOL active structures from a single one of the plurality of MOL structures.

4. The method of claim 1, wherein the plurality of MOL structures are defined to be at a substantially regular pitch that is smaller than the irregular pitch.

5. The method of claim 1, further comprising:
   forming an inter-level dielectric (ILD) layer over the plurality of MOL active structures; and
   forming a plurality of vias within the ILD layer, the plurality of vias contacting the MOL active structures and respectively having sidewalls that continuously extend between a bottom of the ILD layer and a top of the ILD layer.

6. The method of claim 1, further comprising:
   forming the plurality of source and drain regions along a first line extending in a first direction;
   forming a second plurality of source and drain regions within the substrate along a second line extending in the first direction, the first line separated from the second line along a second direction perpendicular to the first direction; and
   wherein the plurality of gate structures comprise a first gate structure extending in the second direction over the first line and the second line.

7. The method of claim 6,
   wherein the plurality of MOL dummy structures comprise a second MOL dummy structure extending over the first line in the second direction and a third MOL dummy structure extending over the second line in the second direction; and
   wherein the second MOL dummy structure is not aligned in the second direction with the third MOL dummy structure.

8. The method of claim 1, wherein the plurality of MOL active structures comprise:
   a second MOL active structure having a third length; and
   a third MOL active structure that is a closest neighboring MOL active structure to the second MOL active structure, the third MOL active structure having a fourth length greater than the third length.

9. A method of forming an integrated chip, comprising:
   forming a plurality of gate structures extending over a substrate along a first direction and separated along a second direction that is perpendicular to the first direction;
   forming a first plurality of source and drain regions along opposing sides of the plurality of gate structures and along a first line extending in the second direction,
   forming a second plurality of source and drain regions along opposing sides of the plurality of gate structures and along a second line extending in the second direction;
   defining a plurality of middle-of-the-line (MOL) structures at locations laterally interleaved between the plurality of gate structures, wherein the plurality of MOL structures comprise a plurality of MOL active structures and a plurality of MOL dummy structures, the plurality of MOL dummy structures not configured to be subsequently connected to an overlying conductive interconnect; and redefining the plurality of MOL structures by eliminating a first segment of the plurality of MOL dummy structures from over the first plurality of source and drain regions and a second segment of the plurality of MOL dummy structures from over the second plurality of source and drain regions, wherein a first position from which the first segment was removed is separated from a third segment of the plurality of MOL dummy structures that extends past opposing sides of the first plurality of source and drain regions by a first non-zero distance measured along the second direction and wherein the third segment of the plurality of MOL dummy structures is separated from a second position from which the second segment was removed by a second non-zero distance measured along the first direction.

10. The method of claim 9, further comprising:
forming an inter-level dielectric (ILD) layer over the plurality of MOL active structures and the plurality of MOL dummy structures, wherein the plurality of MOL dummy structures are completely covered by the ILD layer.

11. The method of claim 9, wherein redefining the plurality of MOL structures separates one of the plurality of MOL structures into two separate MOL active structures.

12. The method of claim 9,
wherein the plurality of MOL active structures are arranged along the first line and over the first plurality of source and drain regions at an irregular pitch.

13. The method of claim 9, wherein the plurality of MOL structures are defined using a first mask and are redefined using a cut mask.

14. The method of claim 9, wherein the first plurality of source and drain regions are not separated from the second plurality of source and drain regions by intervening source and drain regions.

15. The method of claim 9, wherein the first position from which the first segment was removed is separated from a fourth segment of the plurality of MOL dummy structures that extends past opposing sides of the second plurality of source and drain regions by a third non-zero distance measured along the first direction.

16. A method of forming an integrated chip, comprising:
forming a plurality of source and drain regions within a substrate;
forming a plurality of gate structures over the substrate at a substantially regular pitch in a first direction;
defining a plurality of MOL structures over the plurality of source and drain regions;
redefining the plurality of MOL structures, wherein redefining the plurality of MOL structures comprises:
forming a plurality of middle-of-the-line (MOL) active structures contacting one or more of the source and drain regions and having a substantially same height as the plurality of gate structures, wherein the plurality of MOL active structures are arranged at an irregular pitch that is larger than the substantially regular pitch; and
separating a single one of the plurality of MOL structures into two separate MOL dummy structures, the two separate MOL dummy structures not configured to be connected to an overlying conductive interconnect.

17. The method of claim 16, further comprising:
forming a first inter-level dielectric (ILD) layer over the substrate and laterally between adjacent ones of the plurality of MOL active structures;
forming an etch stop layer having a lower surface directly contacting upper surfaces of the plurality of MOL active structures and the first ILD layer, wherein the etch stop layer contacts the first ILD layer along an interface that continually extends between adjacent ones of the plurality of gate structures; and
forming a plurality of conductive contacts arranged on the plurality of MOL active structures and surrounded by a second ILD layer, wherein the plurality of conductive contacts are respectively coupled to an overlying conductive wire.

18. The method of claim 17, wherein the plurality of conductive contacts have sidewalls defined by a differentiable function that continuously extends between a bottom of the second ILD layer and a top of the second ILD layer.

19. The method of claim 17,
wherein the two separate MOL dummy structures contact the substrate along a top of one of the plurality of source and drain regions.

20. The method of claim 17, wherein the lower surface of the etch stop layer is unbroken between the adjacent ones of the plurality of gate structures.

* * * * *